United States Patent [19]

Watts

[11] 4,292,576

[45] Sep. 29, 1981

[54] MASK-SLICE ALIGNMENT METHOD

[75] Inventor: Roderick K. Watts, Summit, N.J.

[73] Assignee: The United States of America as represented by the Secretary of the Air Force, Washington, D.C.

[21] Appl. No.: 126,072

[22] Filed: Feb. 29, 1980

[51] Int. Cl.³ .............................................. G05B 1/06
[52] U.S. Cl. .................................. 318/640; 250/548; 356/400
[58] Field of Search ................ 318/640; 250/548, 561, 250/571; 356/399, 400, 401

[56] References Cited

U.S. PATENT DOCUMENTS

| | | | |
|---|---|---|---|
| 3,544,801 | 12/1970 | Dyck | 356/400 |
| 3,569,718 | 3/1971 | Borner | 250/571 |
| 4,211,489 | 7/1980 | Kleinknecht et al. | 356/400 |

*Primary Examiner*—J. V. Truhe
*Assistant Examiner*—Eugene S. Indyk
*Attorney, Agent, or Firm*—Donald J. Singer; William Stepanishen

[57] ABSTRACT

A method of aligning an x-ray mask to a pattern on a semiconductor slice utilizing an infrared light source and an alignment pattern pair on the mask and slice to automatically and precisely position the x-ray mask on the semiconductor slice.

10 Claims, 2 Drawing Figures

MASK-SLICE ALIGNMENT METHOD

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to the alignment of objects, and in particular to the automatic alignment of an x-ray mask on a semiconductor slice.

In many manufacturing processes the automatic alignment of one object with respect to a second object is desirable. It is particularly desirable during the production of semiconductor devices to align automatically semiconductor wafers and metallization masks wherein the masks are used to define the areas of these wafers to be etched, diffused, or otherwise operated on. Typically, because of the small sizes of both the wafers and the masks and the difficulty of automatically placing each mask on a wafer, the masks are placed on and aligned with the wafer manually. An operator is required to view each wafer and the overlying mask through a microscope. The adjustments of the relative positions of the wafer and the mask are made by the operator until satisfactory alignment of the two is obtained. However, there are the inherent inaccuracies which are introduced by the human operator, thus the resulting defined areas of the wafer are often not located as accurately as may be desired.

SUMMARY OF THE INVENTION

The present invention utilizes a matching alignment pattern pair for the automatic alignment of an x-ray mask to a semiconductor wafer or disc. A light transmissive pattern which provides orientation in the x-y direction is inscribed on a semiconductor slice. The x-ray mask has a matching pattern which is an opaque or negative pattern with respect to the semiconductor slice pattern. The pattern on the semiconductor slice provides a transmissive window from which the light rays that illuminate the semiconductor slice, can escape. Either the semiconductor slice or the x-ray mask may be automatically moved to minimize the light signal that has passed through first the slice and then the mask.

It is one object of the present invention, therefore, to provide an improved method for automatically aligning an x-ray mask and a semiconductor slice.

It is another object of the invention to provide an improved method for automatically aligning an x-ray mask and a semiconductor slice utilizing a matching alignment pattern pair.

It is still another object of the invention to provide an improved method for automatically aligning an x-ray mask and a semiconductor slice utilizing a light transmissive pattern for the x-y direction on the semiconductor slice.

It is yet another object of the invention to provide an improved method for automatically aligning an x-ray mask and a semiconductor slice in which light rays are passed through the semiconductor slice.

It is still a further object of the invention to provide an improved method for automatically aligning an x-ray mask and a semiconductor slice in which sensors are utilized to detect the light that is transmitted through the slice and mask.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
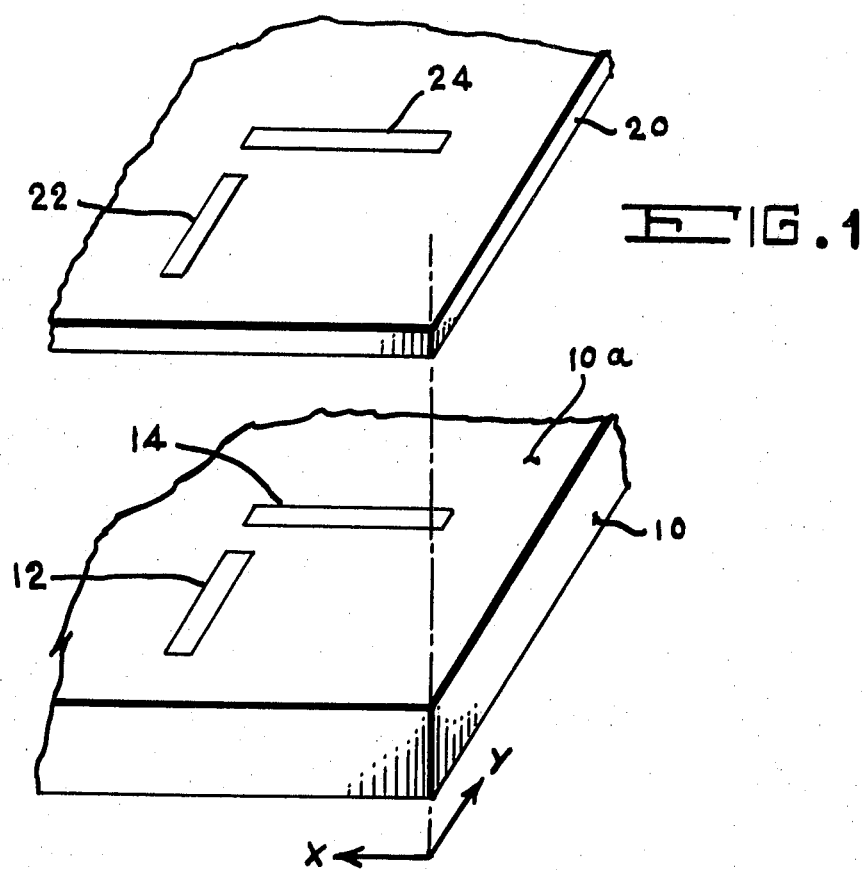
FIG. 1 is a perspective view of a partial section of the x-ray mask and the semiconductor wafer.

Referring now to FIG. 1, there is shown a partial section of the x-ray mask and a semiconductor wafer or slice both of which are shown in spatial alignment. The semiconductor slice 10 is aligned in the x-y orientation as shown. The upper surface of the semiconductor slice 10 upon which the circuit metallization is to be applied has a pair of light transmissive windows 12, 14 formed therein. The windows 12, 14 are positioned on the upper surface of the semiconductor slice 10 with a perpendicular relationship therebetween and also in alignment with the x-y orientation reference. The upper surface 10a comprises a metallic or other opaque coating wherein the light transmissive windows 12, 14 have been created by means of an absence of deposited coating thereon. The x-ray mask 20 is utilized to form the circuit metallization on the semiconductor slice 10 and therefore it is required that an exact alignment within permissible tolerances be achieved. Thus, a matching alignment pattern is provided on the x-ray mask 20 to provide automatic alignment of the x-ray mask 20 with the semiconductor slice 10. The alignment pattern 22, 24 have the same shape, dimensions and x-y orientation as the transmissive windows 12, 14. The alignment pattern 22, 24 which is not light transmissive and therefore is opaque, provides the means to permit the precise alignment of the x-ray mask 20 and the semiconductor slice 10. It should be understood that while the particular pattern shown, has been shown as positioned in one corner of the respective articles, that the matching patterns may be positioned at all the corners or at any other position or location upon both articles. It may be further understood that that present invention is not limited to the particular pattern shown in FIG. 1, but rather that any shape or pattern and also any orientation with respect to the articles and an x-y orientation reference, may be utilized. The embodiment shown is presented merely for illustrative purposes of the present invention.

Figure 2:
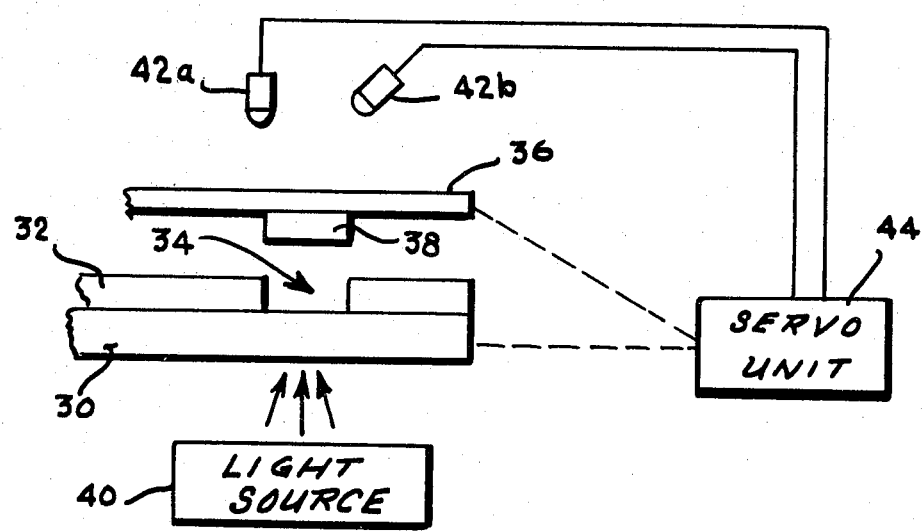
FIG. 2 is a schematic diagram of the mask-slice alignment apparatus in accordance with the present invention.

Turning now to FIG. 2, there is shown the apparatus by which the present alignment method is accomplished. A semiconductor slice 30 is shown with a metallic or other type coating 32 deposited thereupon. The opening 34 in the coating 32 provides a transmission window as described with respect to the semiconductor slice 10 in FIG. 1. The coating 32 is shown in greatly exaggerated dimension to more fully show the window that is established therein. The x-ray mask 36 is shown positioned above the semiconductor slice 30 and is shown with its opaque pattern 39 in close approximate alignment with the transmissive window that is formed by opening 34. The opaque pattern 38 is shown in exaggerated dimension to more fully show its relationship to the transmissive window on the semiconductor slice 30.

The x-ray mask 36 is itself basically transparent with respect to any applied light rays.

There is shown positioned below the semiconductor slice 30, a light source 40 that is applying light rays to and through the semiconductor slice 30. A pair of sensors 42a, b are shown positioned above the x-ray mask 36 to receive any light that has passed through the transmissive window in semiconductor slice 30 and the x-ray mask 36. While the present embodiment has shown two sensors to receive the transmitted light, it should be well understood that the present invention is neither limited to only two sensors nor is it limited to the particular position and/or angles that are shown. The sensors 42a, b convert the received light signals to an electrical signal that is applied to the servo unit 44. The servo unit 44 which is shown controlling the position of both the semiconductor slice 30 and the x-ray mask 36 may be arranged to control the position of either the semiconductor slice 30 or the x-ray mask 36, or both as shown. The servo unit 44 controls the alignment of the semiconductor slice 30 and the x-ray mask 36 such that the electrical signal from the sensors 42a, b is at a minimum. The window may be illuminated through the semiconductor slice 30 by a laser or any other light source that has a wavelength to which the slice is transmissive (generally infrared). The light may be chopped and two or more sensors may be utilized to detect the light that is transmitted through the semiconductor slice and the mask. A servo may move either the mask or the slice or both to minimize the transmitted light signal. As may be seen in FIG. 1, the combination of the transmissive window 12, and opaque pattern 22 is more sensitive to x axis error and the combination of transmissive window 14 and opaque pattern 24 is more sensitive to y axis error.

Although the invention has been described with reference to a particular embodiment, it will be understood to those skilled in the art that the invention is capable of a variety of alternative embodiments within the spirit and scope of the appended claims.

What is claimed is:

1. The method of aligning a mask on a semiconductor slice comprising the steps of:
   forming a light transmissive pattern on a semiconductor slice,
   forming a matching opaque pattern on a mask,
   positioning said mask above said semiconductor slice with the matching patterns in approximate alignment,
   illuminating the bottom of said semiconductor slice with light signals,
   passing said light signals through said light transmissive pattern, and,
   placing said mask on said semiconductor slice and moving said mask to minimize the amount of said light signals that passes through said mask.

2. The method of aligning a mask on a semiconductor slice as described in claim 1 further including the step of:
   moving said mask in any direction in the x-y plane to minimize said light signals that have passed through said mask.

3. The method of aligning a mask on a semiconductor slice as described in claim 1 further including the step of:
   moving said mask to minimize said light signals that have passed through said mask in all directions.

4. The method of aligning a mask on a semiconductor slice as described in claim 1 further including the step of:
   positioning at least two detectors above said mask to detect the amount of said light signals that have passed through said mask.

5. The method of aligning a mask on a semiconductor slice as described in claim 1 further including the step of:
   effecting the relative motion between said mask and said semiconductor slice to maximize the alignment therebetween.

6. The method of aligning a mask on a semiconductor slice as described in claim 1 further including the step of:
   effecting the relative position of said mask to maximize the alignment between said mask and said semiconductor slice.

7. The method of aligning a mask on a semiconductor slice as described in claim 1 further including the step of:
   effecting the relative position of said semiconductor slice to maximize the alignment between said mask and said semiconductor slice.

8. The method of aligning a mask on a semiconductor slice as described in claim 1 further including the step of:
   effecting the relative position of said mask and said semiconductor slice to maximize the alignment therebetween.

9. The method of aligning a mask on a semiconductor slice as described in claim 4 further including the step of:
   applying the output from said detectors to a servo means, said servo means controlling the position of said mask relative to said semiconductor slice.

10. Apparatus for aligning a mask on a semiconductor slice comprising:
    an infrared laser source generating laser light capable of being transmitted through said semiconductor slice positioned to direct laser light through said semiconductor slice from the bottom surface thereof,
    a first mask means on the top surface of said semiconductor slice having orthogonal slits that are transparent to said laser light,
    a second mask means in proximate juxtaposed relationship to said first mask means and having orthogonal slits that are opaque to said laser light and when said first and second masks are in register eliminate the passage of laser light in the vicinity of said orthogonal slits,
    a first laser light detector positioned to receive laser light transmitted through one of said orthogonal slits of said second mask,
    a second laser light detector positioned to receive laser light transmitted through the other of said orthogonal slits of said second mask, and
    a servo circuit responsive to output signals from said first and second light detectors and effecting relative lateral translation of said first and second mask means to provide nulling of the detectors' outputs.

* * * * *